United States Patent [19]
Funato et al.

[11] Patent Number: 6,081,001
[45] Date of Patent: *Jun. 27, 2000

[54] NITRIDE SEMICONDUCTOR LIGHT EMITTING DEVICE

[75] Inventors: Kenji Funato; Tsunenori Asatsuma; Hiroji Kawai, all of Kanagawa, Japan

[73] Assignee: Sony Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/815,205

[22] Filed: Mar. 12, 1997

[30] Foreign Application Priority Data

Mar. 14, 1996 [JP] Japan .................................. 8-057842

[51] Int. Cl.$^7$ .................................................. H01L 33/00
[52] U.S. Cl. ............................... 257/94; 257/96; 257/97; 257/103; 372/43; 372/44; 372/45; 438/46; 438/47
[58] Field of Search .................................. 257/94, 96, 97, 257/103; 372/43, 44, 45, 11; 438/46, 47

[56] References Cited

U.S. PATENT DOCUMENTS

| | | | |
|---|---|---|---|
| 5,617,438 | 4/1997 | Hatano et al. | 372/45 |
| 5,764,842 | 6/1998 | Aoki et al. | 385/131 |
| 5,786,603 | 7/1998 | Rennie et al. | 257/13 |
| 5,866,440 | 2/1999 | Hata | 438/46 |

*Primary Examiner*—William Mintel
*Attorney, Agent, or Firm*—Hill & Simpson

[57] ABSTRACT

A luminous intensity of a semiconductor light emitting device having a multi-layer structure formed of nitride group III-V compound semiconductors is improved by having a thickness d of a light emitting layer (active layer) of the semiconductor light emitting device having a multi-layer structure formed of nitride group III-V compound semiconductors ranging from 0.3 nm to 1.5 nm.

8 Claims, 6 Drawing Sheets

NITRIDE SEMICONDUCTOR LIGHT EMITTING DEVICE

BACKGROUND OF THE INVENTION

1. Field of the Invention

The present invention relates generally to the field of semiconductor light emitting devices, and, more particularly, the present invention relates to a semiconductor light emitting device having a multi-layer structure formed of a nitride group III-V compound semiconductor.

2. Description of the Related Art

A nitride group III-V compound semiconductor, such as GaN, AlGaN, GaInN or the like, has a band gap width ranging from 1.8 eV to 6.2 eV, which makes it theoretically possible to realize a light emitting device which can emit red to ultra violet light. Therefore, such nitride group III-V compound semiconductors have recently attracted attention. When a light emitting device such as a light emitting diode (LED), a semiconductor laser diode (LD) or the like, is manufactured by using such a nitride group III-V compound semiconductor, it is necessary to form a multi-layer structure of, for example, semiconductor layers of GaN, AlGaN, GaInN or the like.

It is considered that a structure formed by substituting nitrogen for arsenic in a GaAs/AlGaAs system double hetero-junction structure (DH), can be practically employed and can be applied to the structure of a nitride laser diode. Nitride laser diode structures obtained by optimization or calculation, using GaAs/AlGaAs theory, have been reported. However, a sufficiently high luminous efficiency, i.e., oscillation of a carrier injection type light emitting device having such a structure, has not been achieved. In particular, a carrier injection type laser structure has not been reported yet.

It is believed by those skilled in the art that the following points are necessary steps for realizing oscillation of the carrier injection type laser, i.e., obtaining the sufficiently high luminous efficiency:

(1) to drastically reduce the defect density in the semiconductor layer from the present level of $10^9$ cm$^{-3}$.

(2) to establish an effective method of forming a reflective end surface of a laser resonator; and (3) to prevent the device from cracking because of the difference among lattice constants of layers in a multi-layer.

Figure 8:
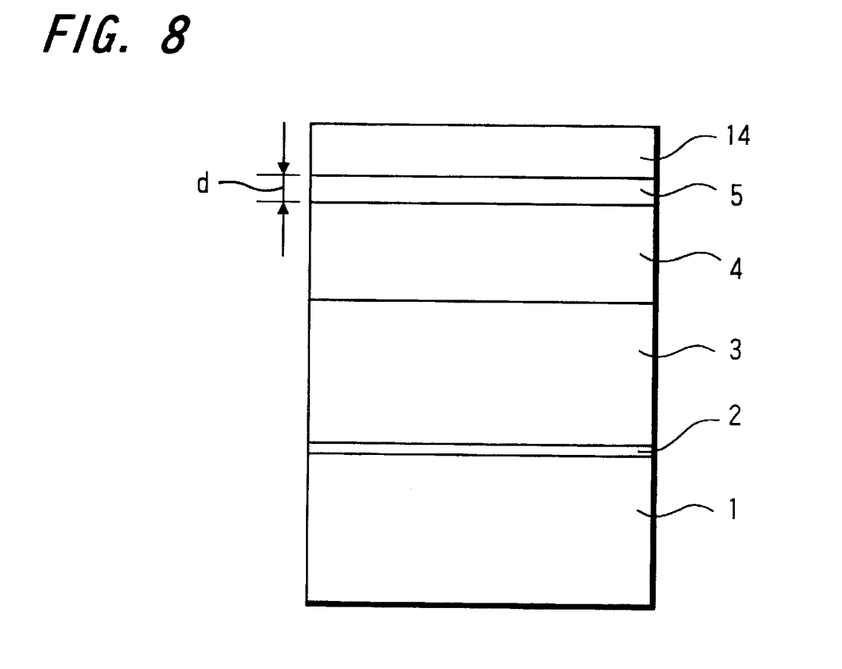
FIG. 8 shows a schematic, cross-sectional view of a semiconductor light emitting device of another comparative example.

Practically, even if the above goals are achieved, it is impossible to obtain a satisfactory nitride light emitting device particularly a carrier injection type laser, which highlights existence of a serious problem. FIG. 8 shows a schematic, cross-sectional view of a light emitting device having a DH structure for optical pumping.

In this example, each layer of this light emitting device is formed by a metal organic chemical vapor deposition (MOCVD) method. A first buffer layer 2 made of GaN with a thickness of 30 nm is formed on a c-plane sapphire substrate 1 by low temperature growth. A second buffer layer 3 made of GaN with a thickness of 2 $\mu$m is grown on the first buffer layer 2. Subsequently, a first cladding layer 4 made of Al$_{0.13}$Ga$_{0.87}$N with a thickness of 0.5 $\mu$m, an active layer 5 made of GaN with a thickness d ranging from 0.01 $\mu$m to 0.5 $\mu$m (10 nm to 500 nm) and a second cladding layer 14 made of Al$_{0.13}$Ga$_{0.87}$N with a thickness 0.1 $\mu$m are successively grown on the second buffer layer 3.

Figure 9:
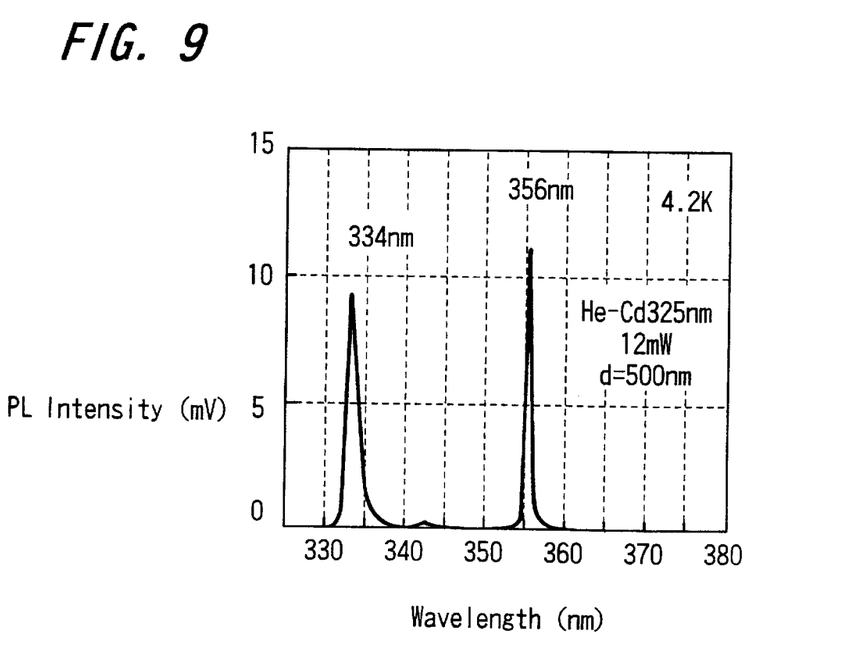
FIG. 9 shows a PL emission spectrum obtained when optical pumping is carried out in a semiconductor light emitting device.

FIG. 9 is a graph showing a photoluminescence (PL) emission spectrum obtained when optical pumping in the active layer 5 with its thickness d=0.5 $\mu$m of the light emitting device shown in FIG. 8 was carried out at a low temperature (4.2 K) with a He—Cd light source (a wavelength of 325 nm) for optical pumping with a power of 12 mW. In this emission spectrum graph, a PL emission peak having a wavelength of 334 nm is presented by light emitted mainly from the second AlGaN cladding layer 14 formed at the surface of the light emitting device and a PL peak having a wavelength of 356 nm is presented by light emitted from the GaN active layer 5. Because the GaN active layer 5 has an absorption coefficient of $10^{-5}$ cm$^{-1}$ or greater, the optical pumping light does not reach the first cladding layer 4. Therefore, PL emission from the first cladding layer 4 is not observed.

A known method of increasing the luminous efficiency in a light emitting device, employing a GaAs/AlGaAs hetero-junction of a III-V compound semiconductor or a ZnSe/ZnCdSe hetero-junction of a III-VI compound semiconductor, is to make the thickness of an active layer thereof thinner. This method is practically employed when a quantum well laser is manufactured. This method of increasing the luminous efficiency utilizes the fact that if a width of a light emitting layer is smaller than a value which is twice a Bohr radius of an exciton, then a low dimension effect produced in such state leads to a change of a state density, increase of an exciton binding energy, increase of an emission transition probability, separation of a valence band and so on and consequently the emission efficiency is increased. In this case, the thickness of the active layer is usually set to be 100 Å or smaller, while it is reported that the thickness is set to 20 Å.

It is considered that in principle this method is effectively employed for fabrication of a light emitting device made of a nitride compound semiconductor. Estimation based on an effective mass shows that when the thickness of an active layer of the nitride light emitting device is set to about 6 nm or smaller, a quantum well effect becomes effective (see Hiroshi Amano et al. Applied Electronic Physical Property Division Lett., vol. 1, No. 3, p25 (1995)). However, even if a light emitting layer of a nitride group III-V compound semiconductor having a hexagonal crystal system is made thinner so as to have a thickness twice of a Bohr radius of an exciton, it is impossible to increase the luminous intensity.

For increasing the luminous efficiency of light having a wavelength of 356 nm from an active layer, i.e., a light emitting layer of the above-mentioned nitride group III-V compound semiconductor light emitting device, it may be considered effective to make the light emitting layer thinner. However, the inventors have found that even if the thickness of the light emitting layer of the semiconductor light emitting device employing GaN/AlGaN hetero-junction or GaN/GaInN hetero-junction is set to 100 Å or smaller, it is impossible to achieve such an increase of the luminous efficiency as is obtained in the light emitting device employing the GaAs/AlGaAs hetero-junction or ZnSe/ZnCdSe hetero-junction. To the contrary, it is observed that the luminous efficiency is lowered as the thickness of the light emitting layer is reduced.

Figure 10:
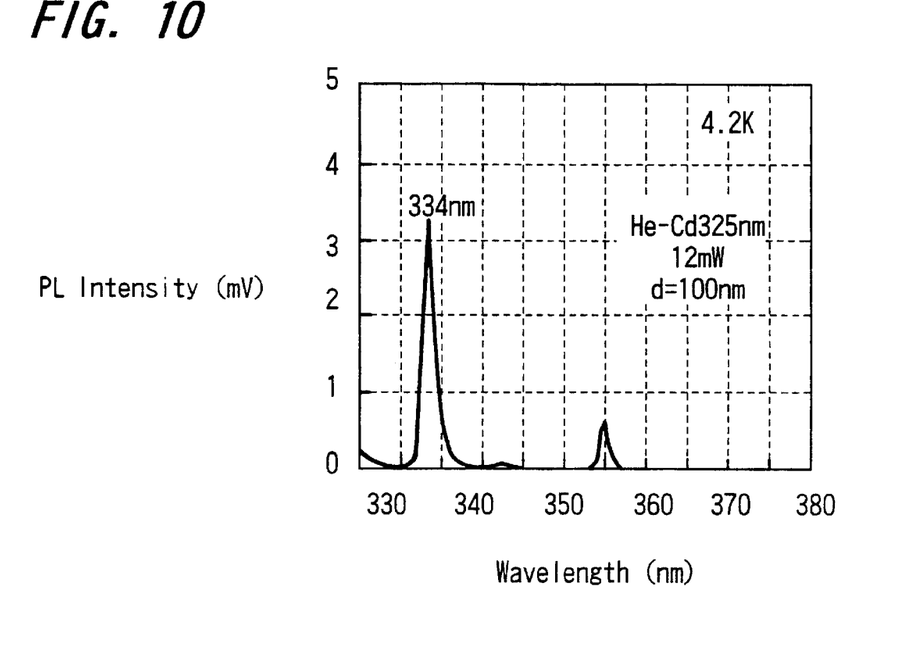
FIG. 10 shows a PL emission spectrum obtained when optical pumping is carried out in the semiconductor light emitting device shown in FIG. 9.
Figure 11:
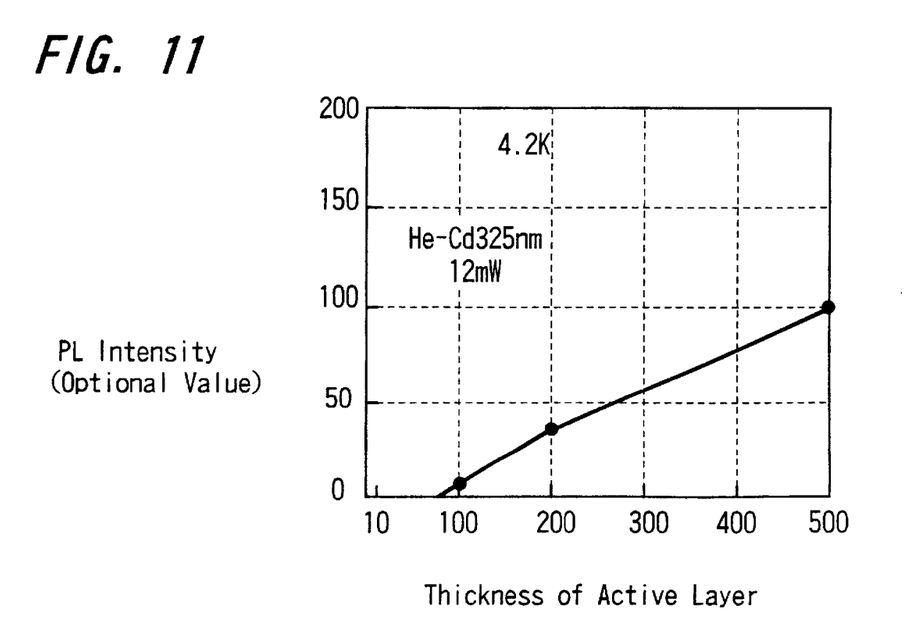
FIG. 11 shows a graph showing a relationship between the thickness of the active layer and the luminous intensity.

Specifically, if the thickness d of the active layer 5 of the light emitting device having an arrangement shown in FIG. 8 is set thinner, e.g., set to d=100 nm, then, as shown in FIG. 10, a PL emission from the active layer 5 is drastically reduced to about 1/20 of that shown in FIG. 9. FIG. 11 is a graph showing a relationship between the thickness d of the active layer 5 and the luminous intensity. Study of FIG. 11 reveals that when the thickness d of the active layer is within the range of d<50 nm, substantially, almost no light from the active layer is observed.

This phenomenon is considered to be a particular phenomenon of the nitride group III-V compound semiconductor light emitting device. The phenomenon may result from the fact that crystals of GaN group, such as GaN, AlGaN, GaInN or the like, have a hexagonal crystal system.

Through various experiments, studies and research, the inventors of the present application have reached the following realization. Specifically, the phenomenon that reduction in the thickness of the active layer lowers the luminous intensity in the light emitting device having a multi-layer structure formed of the above nitride group III-V compound semiconductor. For example, the semiconductor light emitting device, employing the above GaN/AlGaN hetero-junction, indicates the existence of a high-concentration non-radiative recombination centers on a surface of the hetero-junction. The existence of the high-concentration non-radiative recombination centers results from strain which is caused in an AlGaN cladding layer or a GaN active layer because of the difference between lattice constants of the AlGaN cladding layer and the GaN active layer in the nitride group III-V compound semiconductor light emitting device. However, since this phenomenon does not occur in a strain system compound semiconductor light emitting device such as a compound semiconductor light emitting device having a cubic crystal system employing an AlGaAs/InGaAs hetero-junction, it may be considered that this phenomenon is peculiar to the hexagonal crystal system.

SUMMARY OF THE INVENTION

In light of such realizations, it is an object of the present invention to obtain a high luminous efficiency in a nitride compound semiconductor light emitting device, e.g., a semiconductor laser formed of a nitride compound. Specifically, according to the present invention, it is possible to provide a semiconductor light emitting device having a multi-layer structure formed of a nitride group III-V compound semiconductor, such as GaN, AlGaN, GaInN or the like, which can increase its luminous efficiency, which can improve an inherent luminous intensity of a light emitting layer and which may be able to emit light by carrier injection.

According to one aspect of the present invention, a semiconductor light emitting device having a multi-layer structure of a nitride group III-V compound semiconductor includes a light emitting layer having a thickness ranging from 0.3 nm to 1.5 nm. The present invention is made on the basis of the fact that even when the light emitting layer is made thinner and hence has a quantum well structure, if a thickness d of the light emitting layer exceeds about 6 nm, for example, then the luminous intensity of the semiconductor light emitting device is not increased at all, and the fact that when the thickness d of the light emitting layer is set smaller than 2 nm and practically set to 1.5 nm or smaller, which does not exceed half of a Bohr radius of an exciton, the luminous intensity of the light emitting layer is improved. According to the present invention, the thickness d is set to be less than 1.5 nm and a lower limit of the thickness d is 0.3 nm because this is the preferred manufacturing range.

Additional objects, advantages and improvements of the present invention will be apparent from the following brief description of the drawings when viewed in light of the specification.

DETAILED DESCRIPTION OF THE PREFERRED EMBODIMENTS

Semiconductor light emitting devices according to embodiments of the present invention will hereinafter be described with reference to the drawings. According to the present invention, the thickness of a light emitting layer of a semiconductor light emitting device having a multi-layer structure of a nitride group III-V compound semiconductor ranging from 0.3 nm to 1.5 nm. A semiconductor light emitting device according to a first embodiment of the present invention will be described with reference to FIG. 1 which is a schematic, cross-sectional view thereof.

Figure 1:
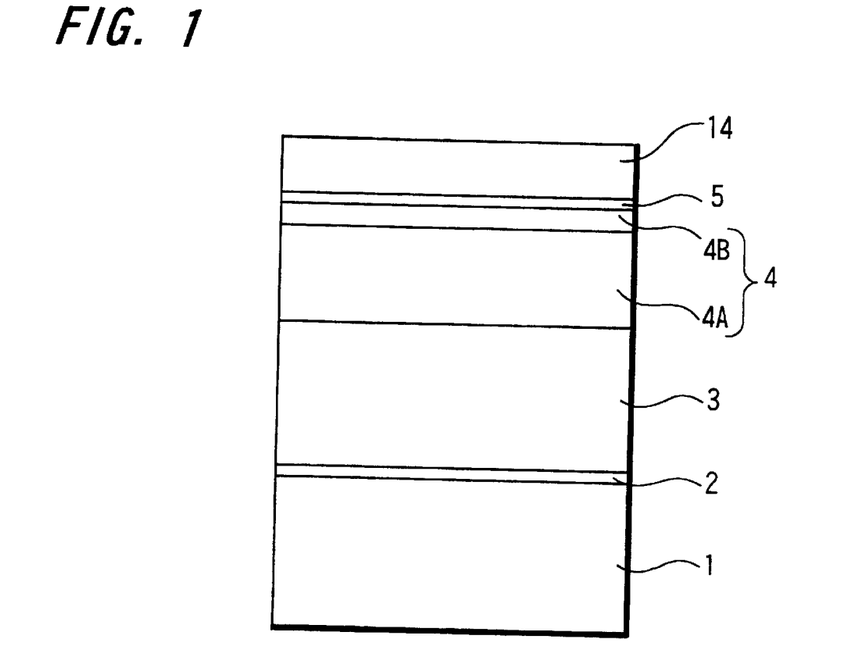
FIG. 1 is a schematic, cross-sectional view of a semiconductor light emitting device according to a first embodiment of the present invention.

A semiconductor light emitting device according to the first embodiment has a double hetero-junction having at least a first cladding layer 4, a light emitting layer, i.e., an active layer 5, and a second cladding layer 14. In this first embodiment, respective semiconductor layers forming the light emitting device were successively formed on a c-plane sapphire substrate 1 by the MOCVD method. Initially, a first buffer 2 made of GaN with its thickness of 30 nm was grown on the substrate 1 at a low temperature of 560° C. A second buffer layer 3 made of GaN was grown on the first buffer layer 2 at a temperature of 1000° C. so as to have a thickness of 2 $\mu$m. The first and second buffer layers 2, 3 may be formed, by a known method, such as one of the methods disclosed in Japanese laid-open patent publication Nos. 229476/1990 and 297023/1992.

The first cladding layer 4 formed of a light absorption layer serving as a lower first cladding layer 4A made of $Al_{0.07}Ga_{0.93}N$ of low Al concentration with a thickness of 0.1 $\mu$m and an upper first cladding layer 4B made of $Al_{0.13}Ga_{0.87}N$ with a thickness of 10 nm were epitaxially grown on the second buffer layer 3. The active layer 5 made of GaN with a thickness of 1 nm and the second cladding layer 14 made of $Al_{0.13}Ga_{0.87}N$ with a thickness of 0.1 μm were successively formed on the first cladding layer 4 by epitaxial growth. In the MOCVD process for growing these AlGaN compound semiconductors, trimethylgallium (TMGa), trimethylaluminium (TMA) and $NH_3$ were respectively used as the source material for Ga, Al and N and a mixed gas of $H_2$ and $N_2$ was used as a carrier gas.

Figure 2:
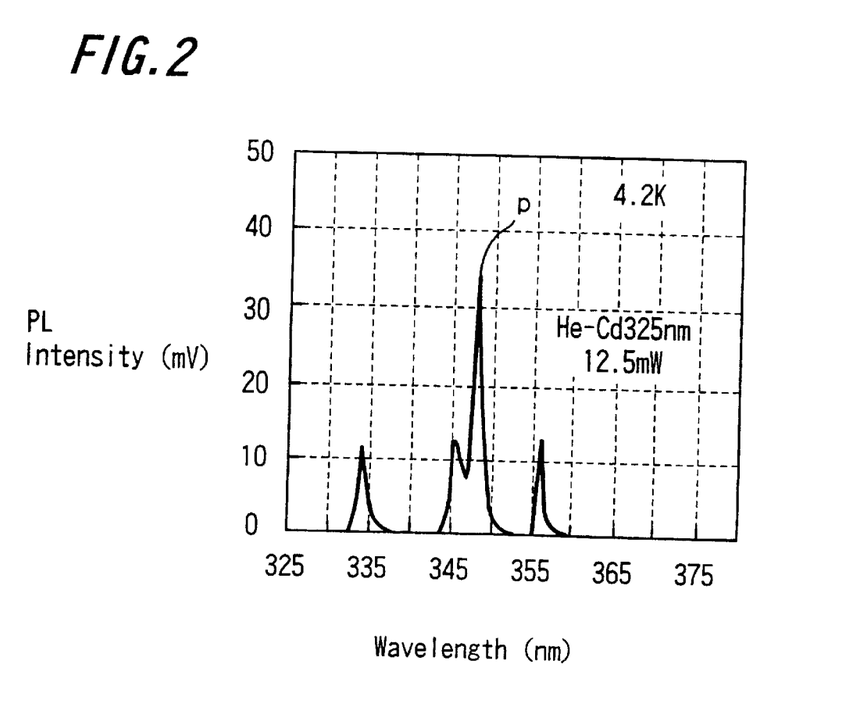
FIG. 2 illustrates a photoluminescence (PL) emission spectrum obtained when optical pumping is carried out in the semiconductor light emitting device according the first embodiment.
Figure 5:
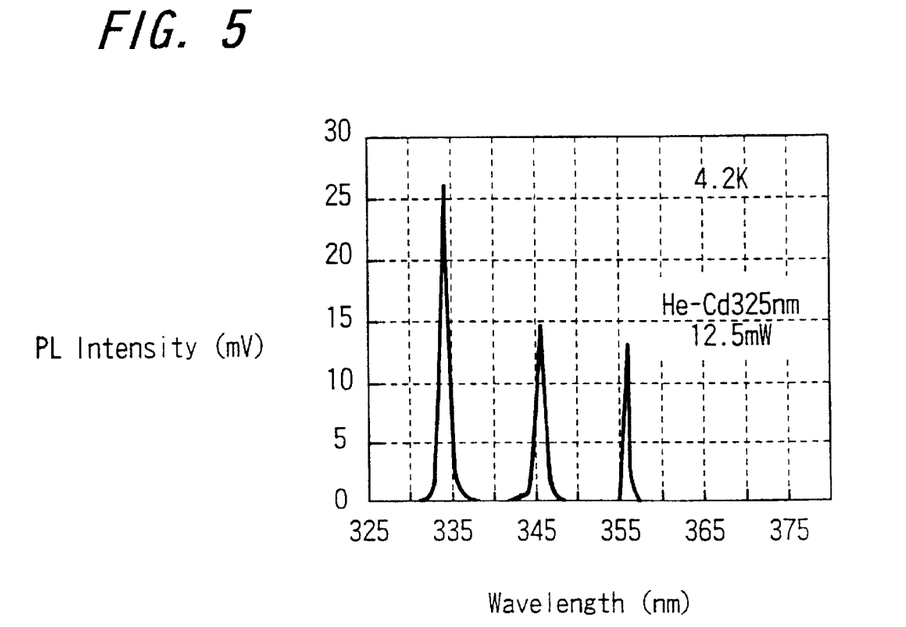
FIG. 5 shows a PL emission spectrum obtained when optical pumping is carried out in a semiconductor light emitting device of a comparative example.

A light emitting device according to comparative example 1 has the same arrangement as that of the light emitting device according to the first embodiment except that a thickness of its active layer 5 is set to 10 nm. FIGS. 2 and 5 show a photoluminescence (PL) emission spectra obtained when optical pumping in the active layers 5 of the light emitting devices according to the first embodiment and the comparative example 1 was carried out at a low temperature (4.2 K) with a He—Cd light source (emitting light having a wavelength of 325 nm) for optical pumping with a power of 12 mW. In each of FIGS. 2 and 5, a PL emission peak having a wavelength of 334 nm and 345 nm is presented by light emitted from the upper first cladding layer 4B and the light absorption layer, i.e., the lower first cladding layer 4A, respectively. In each of FIGS. 2 and 5, a PL emission peak having a wave length of 365 nm is presented by a light emitted from the second buffer layer 2 made of GaN. In FIG. 2 showing the PL emission spectrum according to the first embodiment, a PL emission peak P having a wavelength of 348 nm is generated while corresponding PL emission peak P does not appear in FIG. 5. This PL emission peak P shown in FIG. 2 is presented by light emitted from the thin GaN active layer 5 with a thickness of 1 nm in the semiconductor light emitting device according to the first embodiment.

Figure 3:
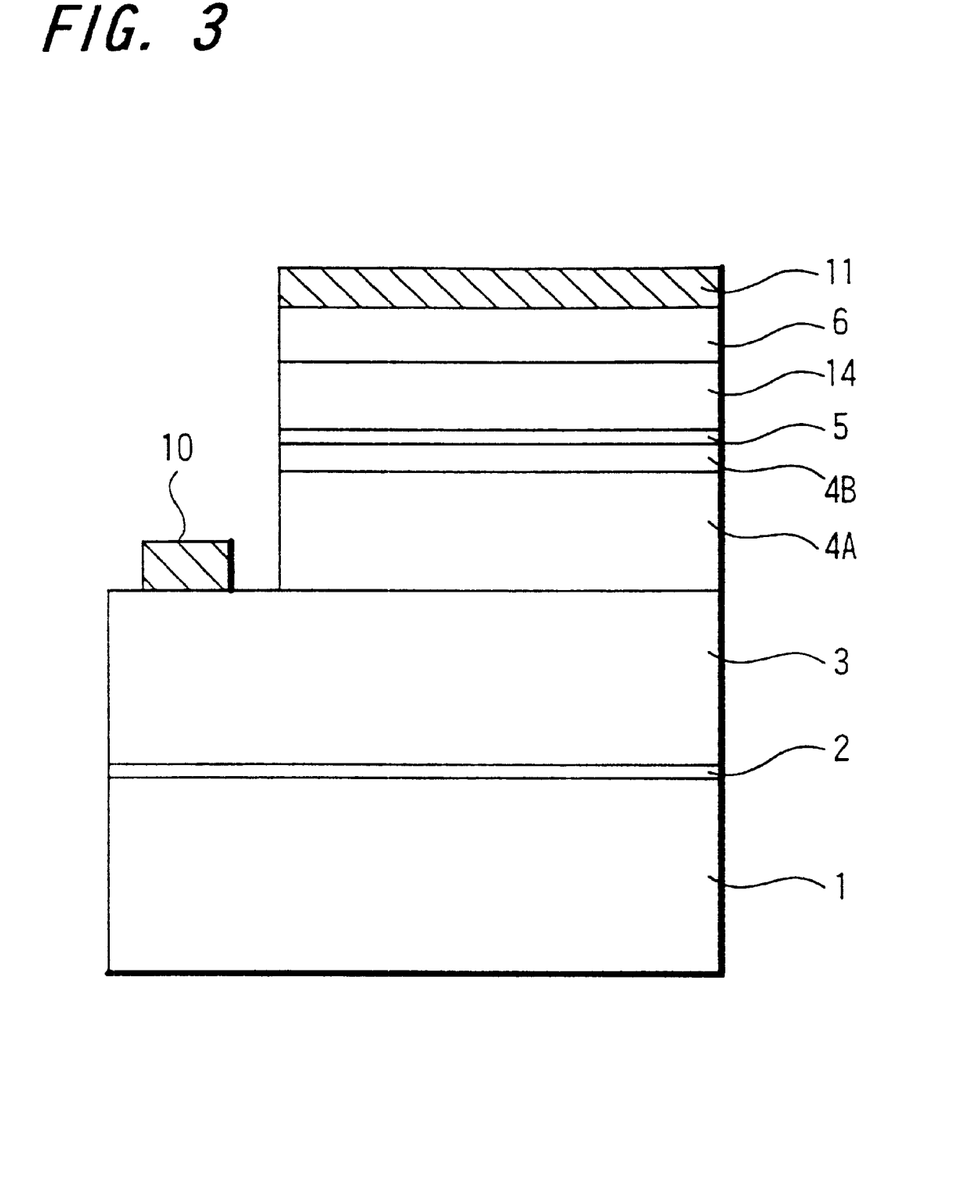
FIG. 3 shows a schematic, cross-sectional view of a semiconductor light emitting device according to a second embodiment of the present invention.

FIG. 3 shows a cross-sectional view of a semiconductor light emitting device according to a second embodiment of the present invention. As shown in FIG. 3, the semiconductor light emitting device according to the second embodiment has almost the same layered structure that of the first embodiment and is arranged as a carrier injection type laser. In FIG. 3, the corresponding parts to those shown in FIG. 1 are marked with the same reference numerals and are therefore not described in detail. In the second embodiment, a cap layer 6 made of GaN was further formed by epitaxial growth on a second cladding layer 14. In this case, a second buffer layer 3 and a first cladding layer 4 are formed as those of a first conductive type, e.g., p type, and the second cladding layer 14 and the cap layer 6 are formed of a second conductive type, e.g., an n type. At least the cap layer 6, the second cladding layer 14, the active layer 5 and the first cladding layer 4 were etched to expose the second buffer layer 3 to the outside. An electrode 10 was deposited on the exposed second buffer layer 3 to provide an ohmic contact therebetween. The other electrode 11 was deposited on the cap layer 6 to provide an ohmic contact therebetween.

In the arrangement of the light emitting device according to the second embodiment, carriers are supplied from the electrodes 10, 11, and laser oscillation is carried out from the active layer 5. For the purpose of facilitating an understanding of the features of the present invention, a layered structure shown in FIG. 6 which is a schematic cross-sectional view, will be described. Each of semiconductor layers, forming this structure shown in FIG. 6, was grown on a c-plane sapphire substrate 1 by MOCVD. Initially, a first buffer layer 2 made of GaN with a thickness of 30 nm was grown on the substrate 1 at a low temperature of 560 C°. A second buffer layer 3 made of GaN was grown on the first buffer layer 2 at a temperature of 1000 C° so as to have a thickness of 2 μm. A first cladding layer 4 made of $Al_{0.13}Ga_{0.87}N$ with a thickness of 0.3 μm a first light emitting layer 5 made of GaN with a thickness of 3 nm, a second cladding layer 14 made of $Al_{0.13}Ga_{0.87}N$ with a thickness of 0.05 μm, a second light emitting layer 15 made of GaN with a thickness of 2 nm, a third cladding layer 24 made of $Al_{0.13}Ga_{0.87}N$ with a thickness of 0.05 μm, a third light emitting layer 25 made of GaN with a thickness of 1 nm, and a fourth cladding layer 34 made of $Al_{0.13}Ga_{0.87}N$ with a thickness of 0.05 μm were successively formed by epitaxial growth on the second buffer layer 3.

Figure 6:
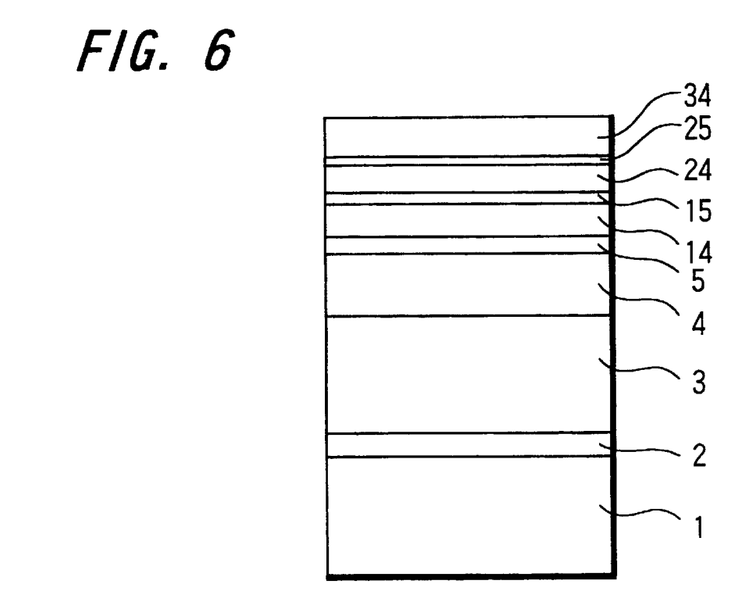
FIG. 6 shows a schematic, cross-sectional view of a semiconductor layered structure.
Figure 7:
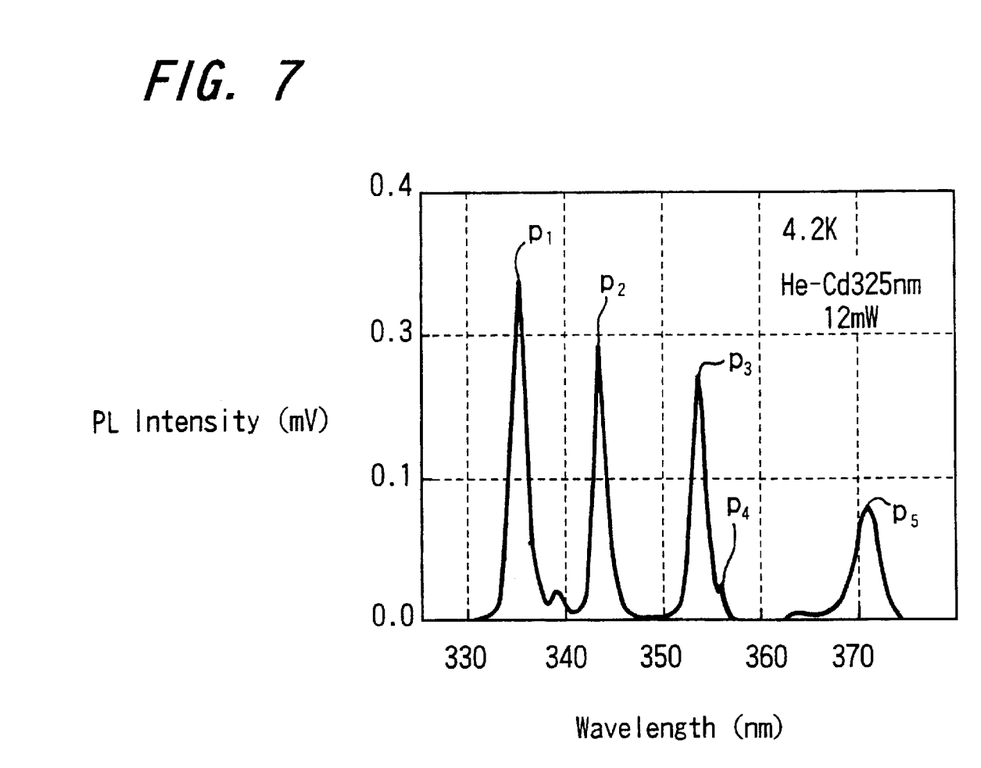
FIG. 7 shows a PL emission spectrum obtained when optical pumping is carried out in a layered structure such as that shown in FIG. 6.

FIG. 7 shows a PL emission spectrum obtained when optical pumping in the layered structure shown in FIG. 6 was carried out at a low temperature (4.2 K) with a He—Cd light source (a wavelength of 325 nm) for optical pumping with a power of 12 mW. In FIG. 7, a first PL emission peak P1 is presented by light emitted from the fourth AlGaN cladding layer 34. A second PL emission peak P2 and a third PL emission peak P3 are respectively presented by lights emitted from the third and second GaN light emitting layer 25,15 with their respective thicknesses of 1 nm and 2 nm. A fourth small PL emission peak P4 is presented by light emitted from the second buffer layer 3 made of GaN. A fifth PL emission peak P5 may be presented by light emitted from an impurity.

In FIG. 7, wavelengths of light emitted from the second and third light emitting layers 15, 25 are shifted toward a low energy side as compared with calculated values of a quantum well energy. It is understood that this shift results from an increase of a Stark shift and an exciton binding energy by a piezo effect.

Study of FIG. 7 reveals that no light seems to be emitted from a quantum well of the first light emitting layer 5 made of GaN with a thickness of 3 nm. Specifically, study of the PL emission spectrum shown in FIG. 7 reveals that when the thickness of the first light emitting layer 5 is 3 nm, the luminous intensity of light emitted therefrom is quite small. As described above, when the thickness of the light emitting layer according to the present invention is set equal to or less than 1.5 nm which is thinner than 2 nm, it is possible to obtain a sufficiently high luminous intensity.

As described above, according to the present invention, since the thickness of the light emitting layer, i.e., the active layer 5 is set to be 1.5 nm or smaller, i.e., set smaller than a half of the Bohr radius of the exciton of the GaN compound semiconductor, it is possible to improve the luminous intensity. Furthermore, if the active layer 5 has no strain, it is possible to obtain higher luminous intensity. Specifically, since the GaN buffer layer and the AlGaN cladding layer, according to the first and second embodiments and the comparative example 1, have different lattice constants, the AlGaN cladding layer 4 formed on the GaN buffer layer is strained. However, as the thickness of the AlGaN first cladding layer 4 is increased, defects such as a misfit dislocation or the like are produced. Thus, the strain of the first cladding layer 4 is removed. On the other hand, when the GaN active layer 5 having a lattice constant different from that of the first cladding layer 4 is formed on the first cladding layer 4, the active layer 5 is strained.

In the present invention, when the first cladding layer 4 is formed in each of the semiconductor light emitting devices according to the first and second embodiments, the lower first cladding layer 4A with a low Al concentration, i.e., made of AlGaN whose lattice constant has only a small difference from that of GaN is formed and the upper cladding layer 4B made of $Al_{0.13}Ga_{0.87}N$ having a high Al concentration is formed on the lower first cladding layer 4A so as to be sufficiently thin. Thus, no strain is produced in the active layer 5 formed on the upper first cladding layer 4B.

On the other hand, since each of the semiconductor light emitting devices shown in FIGS. 6 and 8 does not employ such arrangement for avoiding the stain in the active layer 5, the GaN active layer 5 is strained.

Figure 4:
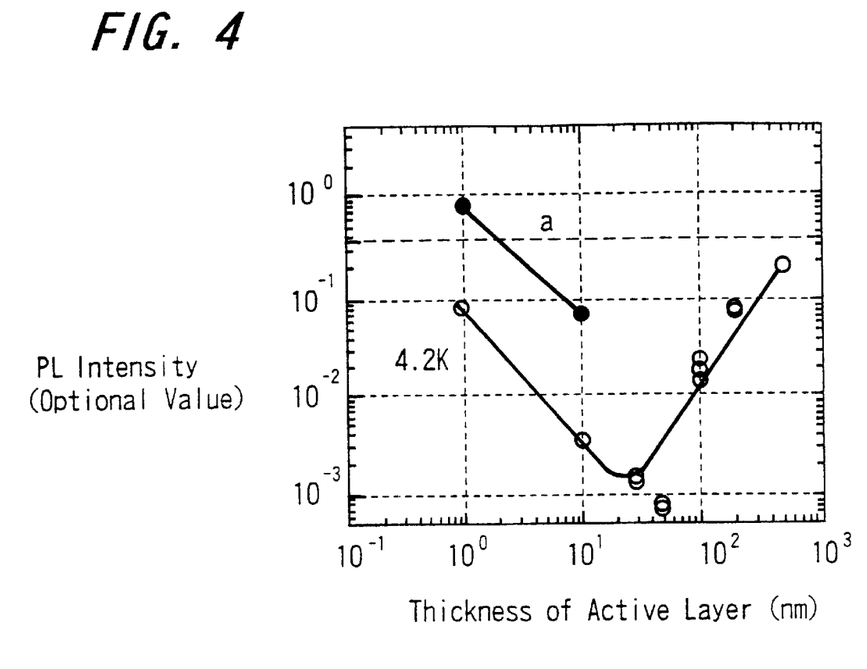
FIG. 4 shows a graph showing a relationship between a thickness of an active layer and an integrated PL intensity with respect to an active layer having strain and an active layer having no strain.

FIG. 4 is a graph showing a relationship between a thickness of a quantum well formed as the active layer, i.e., a thickness of the active layer and an integrated PL intensity with respect to an active layer having strain and an active layer having no strain. In FIG. 4, a solid circle represents a value of the active layer having no strain, and an open circle represents a value of the active layer having strain. Study of FIG. 4 and comparison between the active layer having strain and the active layer having no strain reveals that, if the active layer has no strain, then a considerably high luminous intensity can be achieved when the thickness of the active layer is equal to or less than 1.5 nm and particularly in the vicinity of 1 nm.

Therefore, it can be understood that, when the semiconductor light emitting device according to the present invention is formed, it is preferable to form the cladding layer having strain by selecting an arrangement of the AlGaN cladding layer 4 and to form the active layer having substantially no strain or having no strain as described in the first and second embodiments.

As described above, a quantum well of a GaAs compound semiconductor light emitting device has a property and a nature different from those of a quantum well of a III-V compound semiconductor light emitting device of GaAs system or a quantum well of a III-VI compound semiconductor light emitting device employing a ZnSe/ZnCdSe hetero-junction. The reason for this difference lies in the possibility that the GaN/AlGaN hetero-junction has more non-luminous levels on its hetero-junction surface as compared with hetero-junction employing other materials.

It is known that if a multi-layer film is formed of hexagonal crystal system materials having different lattice constants in the direction perpendicular to a c-axis (0001) direction, a charge is induced by a piezo electric field and consequently a band is deformed (see A. Bykhovski, A. P. L.63(16), 2243 (1993)). It is considered that, as the result of this phenomenon, in the semiconductor light emitting device employing a GaN/AlGaN hetero-junction, light emission is lowered because of separation of an electron and a hole in a quantum well due to the Stark effect and a non-radiative center is formed by a surface charge. On the other hand, since every general semiconductor laser is formed of a cubic crystal system semiconductor, even if the semiconductor laser is formed of a lattice-mismatched multi-layer film, it is prevented from having the above-mentioned disadvantages inherent in the semiconductor light emitting device employing GaN/AlGaN hetero-junction in principle.

When the semiconductor light emitting device employs a GaN/AlGaN hetero-junction, its quantum effect must be large enough to overcome the above disadvantages inherent therein. Results of the above experiments show that, in order to overcome such disadvantage, the thickness of the light emitting layer, i.e., the active layer must be set smaller than 2 nm and particularly equal to or less than 1.5 nm. An electron effective mass of InGaN is smaller than that of GaN, and hence an effective width of quantum well of an InGaN active layer is larger than that of a GaN active layer. In the light emitting device employing GaN/AlGaN hetero-junction, the width of the quantum well is half of the Bohr radius of an exciton.

As described above, according to the present invention, it is possible to obtain a nitride compound semiconductor light emitting device having high luminous intensity, and hence it is possible to obtain a carrier injection type light emitting device, e.g., a carrier injection type semiconductor laser.

While the semiconductor light emitting device employing the GaN/AlGaN hetero-junction is used in each of the above first and second embodiments, the present invention is not limited thereto and the present invention can be applied to a semiconductor light emitting device employing GaN/InGaN hetero-junction. It is needless to say that various changes and modifications can be effected in a structure of laminated semiconductor layers without departing from the spirit or scope of the present invention.

As described above, according to the present invention, it is possible to obtain a nitride compound semiconductor light emitting device which can emit a high luminous intensity light, and hence it is possible to obtain a carrier injection type light emitting device, e.g., a carrier injection type semiconductor laser. Therefore, it is possible to realize a light emitting device for emitting light of a short wavelength in the range of ultraviolet rays. As a result, when the semiconductor light emitting device according to the present invention is used as a light source for various optical recording and reproduction, it is possible to record and reproduce data with high recording density and high resolution.

The present invention is subject to many variations, modifications and changes in detail. It is intended that all matter described throughout the specification and shown in the accompanying drawings be considered illustrative only. Accordingly, it is intended that the invention be limited only by the spirit and scope of the appended claims.

We claim as our invention:

1. A semiconductor light emitting device comprising:
   a substrate, a first cladding layer, a light emitting layer, and a second cladding layer;
   said light emitting layer comprises a III-V compound semiconductor which has nitride as the group V material; and
   wherein a thickness d of said light emitting layer is between 0.3 nm and 0.5 nm.

2. The semiconductor device as described in claim 1, wherein said first and second cladding layers comprise III-V compound semiconductor which have nitride as the group V material.

3. The semiconductor device as described in claim 2, wherein said light emitting layer and said first and second cladding layers comprise a material selected from the group consisting of GaN, AlGaN, GaInN and AlGaInN.

4. The semiconductor device as described in claim 1, wherein said light emitting layer has no strain.

5. The semiconductor device as described in claim 1, wherein said first and second cladding layers are AlGaN layers, and said light emitting layer is a GaN layer.

6. The semiconductor device as described in claim 1, wherein said first cladding layer comprises a lower cladding layer and an upper cladding layer.

7. A layered structure for a semiconductor light emitting device comprising:
   a substrate, a first cladding layer, a light emitting layer, and a second cladding layer;
   wherein at least one of said first and second cladding layers and said light emitting layer comprises a material selected from the group consisting of GaN, AlGaN, GaInN and AlGaInN; and
   wherein a thickness d of said light emitting layer is $\leq 1.5$ nm and smaller than a half of the Bohr radius of the exciton of said light emitting layer.

8. The semiconductor device of claim 7, wherein the thickness d of the light emitting layer is $\geq 0.3$ nm.

* * * * *